United States Patent
Miyagi

(10) Patent No.: US 7,368,981 B2
(45) Date of Patent: May 6, 2008

(54) LIMIT CIRCUIT

(75) Inventor: Hiroshi Miyagi, Jouetsu (JP)

(73) Assignees: Niigata Seimitsu Co., Ltd., Niigata (JP); Ricoh Company, Ltd., Tokyo (JP)

( * ) Notice: Subject to any disclaimer, the term of this patent is extended or adjusted under 35 U.S.C. 154(b) by 928 days.

(21) Appl. No.: 10/450,429

(22) PCT Filed: Dec. 20, 2001

(86) PCT No.: PCT/JP01/11185

§ 371 (c)(1),
(2), (4) Date: Jun. 11, 2003

(87) PCT Pub. No.: WO02/052737

PCT Pub. Date: Jul. 4, 2002

(65) Prior Publication Data

US 2004/0109277 A1 Jun. 10, 2004

(30) Foreign Application Priority Data

Dec. 20, 2000 (JP) ............................. 2000-391479
Jun. 29, 2001 (JP) ............................. 2001-198218

(51) Int. Cl.
*H03K 5/00* (2006.01)
(52) U.S. Cl. ...................................... 327/557; 327/552
(58) Field of Classification Search ......... 327/551–563
See application file for complete search history.

(56) References Cited

U.S. PATENT DOCUMENTS 6,498,927 B2 * 12/2002 Kang et al. ............... 455/245.2
6,577,190 B2 * 6/2003 Kim ........................... 330/133
6,628,932 B1 * 9/2003 Myers ...................... 455/234.1
7,003,271 B2 * 2/2006 Kluge et al. ............. 455/240.1

FOREIGN PATENT DOCUMENTS

| JP | 51-104278 | 9/1976 |
| JP | 55-72329 | 5/1980 |
| JP | 63-33209 | 3/1988 |
| JP | 6-303065 | 10/1994 |
| JP | 11-251852 | 9/1999 |
| JP | 2000-201033 | 7/2000 |
| JP | 2000-269756 | 9/2000 |

* cited by examiner

Primary Examiner—Dinh T. Le
(74) Attorney, Agent, or Firm—patenttm.us

(57) ABSTRACT

A limit circuit capable of providing high gain. The limit circuit included in an FM receiver comprises, for example, seven amplifiers (11 to 17), and a BPF (18) inserted substantially in the middle thereof. Each of the amplifiers (11 to 17) operates as a differential amplifier, and has a gain of about 13 dB. The BPF (18) serving as a limit circuit passes components in a bandwidth wider than the bandwidth of the signal to be amplified. The level of 1/f noise and heat noise can be reduced by eliminating low-frequency components and high-frequency components of the Signal amplified by the four amplifiers (11 to 14), respectively. Therefore, each of the amplifiers (15 to 17) connected to the rear end of the BPF (18) is not animated by the noise component.

20 Claims, 11 Drawing Sheets

LIMIT CIRCUIT

BACKGROUND OF THE INVENTION

1. Field of the Invention

The present invention relates to a limit circuit used in an FM receiver and so on.

2. Description of the Related Art

An amplitude of an FM wave received by an FM receiver is not constant because it is influenced by fading, a multipath and so on. If such a received wave is FM-detected as it is, distortion and noise are mixed in detection output, and so a limit circuit is generally used. In particular, a limit amplifier of a high gain is used as the limit circuit recently.

Incidentally, in order to realize the limit amplifier of a high gain as mentioned above, it is necessary to connect amplifiers of a relatively low gain in multiple stages. For instance, in the case of realizing a gain of 90 dB or so and using a differential amplifier of 13 dB or so in each stage, it is necessary to set the number of stages at seven stages.

However, there is a problem that in the case of the high gain of 90 dB or so, the amplifiers are saturated with noise components included in a signal which is a subject of amplification, so that the high gain of 90 dB or so which is realizable in design cannot be obtained in reality. For instance, it was verified that, when operation of the above-mentioned limit circuit comprised of seven-stage differential amplifiers was simulated by using a simulation tool and an experiment was performed by actually building the circuit, only the gain of 60 dB or so could be obtained.

SUMMARY OF THE INVENTION

The present invention has been created in consideration of the above-described points, and an object of the present invention is to provide a limit circuit which can obtain a high gain.

In order to solve the above-mentioned problem, a limit circuit of the present invention is provided in a foregoing stage to a detection circuit of a receiver and comprises amplifiers cascaded in a plurality of stages and a bandpass filter inserted in a middle stage of the plurality of amplifiers. And a passing frequency band of this bandpass filter is set wider than a band of a detected signal inputted to the detection circuit. It is possible, by using the bandpass filter having a passing band wider than the band of the signal amplified in the limit circuit, to eliminate 1/f noise existing on a lower-frequency side than the passing band and heat noise existing on a higher-frequency side than that. Therefore, it is possible to prevent the amplifiers from being saturated with such noise, and only a signal component to be originally amplified can be amplified so that a high gain can be obtained as the entire limit circuit.

In particular, the above-mentioned amplifiers are differential amplifiers for differentially operating two transistors, and it is desirable to set the number of the amplifiers at seven and insert the bandpass filter into a subsequent stage to the amplifier in the third or fourth stage which is the middle stage thereof. In the case where the number of the stages of the amplifiers is seven, the more subsequent the stage is, the more easily the noise components get accumulated and the amplifiers tend to be saturated. However, it is possible to eliminate the noise components accumulated till then by passing the signal outputted from the amplifier in the third or fourth stage which is the middle stage thereof through the bandpass filter so as to prevent the amplifiers of the stages more subsequent than the bandpass filter from becoming saturated with the noise components and increase the gain of the entire limit circuit.

The limit circuit of the present invention is provided in the foregoing stage to the detection circuit of the receiver and comprises the amplifiers cascaded in a plurality of stages. And the amplifier in each stage has high-frequency component elimination unit for eliminating the components higher-frequency than an upper limit of the band of the detected signal inputted to the detection circuit and low-frequency component elimination unit for eliminating the components lower-frequency than a lower limit of the band of the detected signal. As the components other than the band of the detected signal are eliminated in th amplifier in each stage, the gain is not limited by the noise components so that the high gain can be obtained as the entire limit circuit.

In particular, it is desirable that the above-mentioned low-frequency component elimination unit be a high-pass filter in which a cutoff frequency is set at a value lower than the lower limit of the band of the detected signal. It is possible, by providing the high-pass filter on an output side of the amplifier in each stage, to easily eliminate the 1/f noise lower than the cutoff frequency of the high-pass filter.

In addition, it is desirable that the above-mentioned amplifier be the differential amplifier for differentially operating two transistors, and the low-frequency component elimination unit be a feedback circuit for inputting the signal in which low-frequency components of differential output signals of the amplifier in each stage are synthesized in phase to the two transistors. It is possible, by synthesizing only the low-frequency components included in the differential output signals of the differential amplifiers and feeding them back in phase to an input side, to stop differential operation of the differential amplifiers corresponding to the low-frequency components so as to reduce the 1/f noise included in the low-frequency components.

Moreover, the limit circuit of the present invention is provided in the foregoing stage to the detection circuit of the receiver and comprises the amplifiers cascaded in a plurality of stages. And the amplifier in each stage has the high-frequency component elimination unit for eliminating the components higher-frequency than the upper limit of the band of the detected signal inputted to the detection circuit. And the limit circuit has the feedback circuit for feeding back the components lower-frequency than the lower limit of the band of the detected signal included in the output signal of the amplifier in the final stage to the first-stage amplifier in a reversed phase. As only the low-frequency components included in the output signal of the final-stage amplifier are fed back to the input side of the first-stage amplifier in the reversed phase and the low-frequency components are thereby cancelled, it is possible to eliminate the 1/f noise included in the low-frequency components.

In particular, it is desirable that the above-mentioned high-frequency component elimination unit be a low-pass filter in which the cutoff frequency is set at a value higher than the upper limit of the band of the detected signal. It is possible, by providing the low-pass filter on the output side of the amplifier in each stage, to easily eliminate the heat noise higher than the cutoff frequency of the low-pass filter.

It is also desirable to use a parasitic capacitance of a transistor included in the amplifier in the next stage as a capacitor included in the low-pass filter. It is possible, by utilizing the parasitic capacitance of the transistor instead of the capacitor as a stand-alone component, to reduce the number of components and thereby reduce the cost.

The limit circuit of the present invention is provided in the foregoing stage to the detection circuit of the receiver and comprises the amplifiers cascaded in a plurality of stages. And p-channel type FETs are used as amplifying elements included in the stages at least before an m-th stage of the amplifiers. It is possible, by using the p-channel type FETs of which mobility is low, to curb occurrence of the 1/f noise so as to prevent the amplifiers from being saturated with the 1/f noise.

It is also desirable to use n-channel type FETs as the amplifying elements included in the amplifiers from an m+1-th stage onward. It is possible, by using the n-channel type FETs as the amplifying elements included in the amplifiers in the subsequent stages which do not contribute so much to prevention of saturation of the amplifiers, to render the space of component parts smaller compared to the case of entirely using the p-channel type FETs.

It is also desirable to set a channel length L and a channel width W of the FETs included in the amplifiers up to the m-th stage at values larger than the channel length L and channel width W of the FETs included in the amplifiers from the m+1-th stage onward. It is possible, by setting at large values only the channel length L and channel width W of the FETs included in the amplifiers in the foregoing stages which significantly contribute to the prevention of saturation of the amplifiers, to render the space of component parts smaller compared to the case of rendering these values larger for all the FETs.

It is also desirable, when attention is paid to the FETs included in the plurality of amplifiers connected in the multiple stages as the amplifying elements, to set th channel length L and channel width W of the FETs included in the amplifiers placed in the foregoing stages at values larger than the channel length L and channel width W of the FETs included in the amplifiers placed in the subsequent stages thereto. It is generally known that the 1/f noise generated in the FETs increases in proportion to the respective reciprocals of the channel length L and channel width W. Therefore, it is possible, by setting the channel length L and channel width W large, to reduce the 1/f noise generated in the FETs. In particular, when considering the FETs connected in the multiple stages, the 1/f noise generated in the FETs included in the foregoing stages is amplified in the FETs in the subsequent stages thereto so that it is desirable to reduce the 1/f noise generated in the FETs included in the foregoing stages for the sake of reducing overall low-frequency noise. Moreover, the 1/f noise generated in the FETs included in the subsequent stages is amplified to a lesser degree in the FETs in the more subsequent stages so that it supposedly contributes less to reduction in the overall low-frequency noise. Therefore, it is possible, by setting the channel length L and channel width W in the FETs included in the subsequent stages at values smaller than those of the FETs in the preceding stages, to reduce the space occupied by the FETs so as to reduce the costs by miniaturizing the chips.

It is also desirable, when attention is paid to the FETs included in the plurality of amplifiers connected in the multiple stages as the amplifying elements, to set the channel length L and channel width W of each FET so that the noise component generated by the FET becomes smaller than that included in an input signal of the FET. It is possible, by rendering the noise component generated by any of the FETs smaller than that included in the input signal of the FET, to reduce the overall low-frequency noise.

It is also desirable to have the component parts integrally formed on a semiconductor substrate by using a CMOS process or a MOS process. It is possible, by using these processes, to simplify the process compared to the cases of using a bipolar process and so on so as to allow the component costs and the product costs including the limit circuit to be reduced.

It is also desirable that the above-mentioned semiconductor substrate have an N-well formed thereon and all or a part of the component parts be formed on the N-well. It is possible, by forming all or a part of the component parts on the N-well, to prevent a noise current from running via a pn joint surface formed between the N-well and the semiconductor substrate under it so as to prevent the noise generated in the circuit on the N-well from running round to another component through the semiconductor substrate.

It is also desirable that the above-mentioned semiconductor substrate have a guard ring formed around the component parts. It is thereby possible to further effectively prevent the noise generated in the circuit formed on the N-well from running round to another component through the semiconductor substrate.

It is also desirable to have the above-mentioned guard ring formed from a semiconductor substrate surface down to a position deeper than the N-well. It is possible, by forming the guard ring to the deep position, to eliminate the 1/f noise in a low-frequency area running round beyond the guard ring.

DETAILED DESCRIPTION OF THE PREFERRED EMBODIMENTS

Hereafter, a limit circuit according to an embodiment to which the present invention is applied will be described in detail.

First Embodiment

Figure 1:
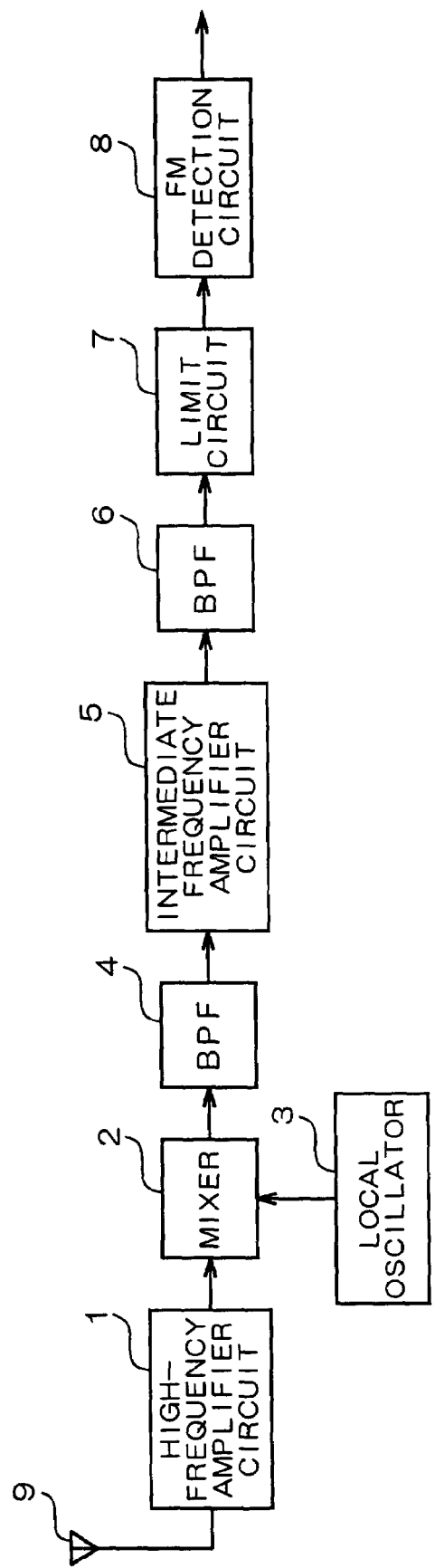
FIG. 1 is a diagram showing a general configuration of an FM receiver including the limit circuit according to a first embodiment.

FIG. 1 is a diagram showing a general configuration of an FM receiver including the limit circuit according to a first embodiment. As shown in FIG. 1, the FM receiver has a high-frequency amplifier circuit 1, a mixer 2, a local oscillator 3, BPF (Band Pas Filter) 4 and BPF 6, a intermediate frequency amplifier circuit 5, a limit circuit 7 and an FM detection circuit 8. An FM wave received by an antenna 9 is amplified by a high-frequency amplifier circuit 1 and then a local oscillation signal outputted from a local oscillator 3 is mixed so as to perform a frequency conversion from a high-frequency signal to an intermediate frequency signal. For instance, if a frequency of a signal outputted from the high-frequency amplifier circuit 1 is f1 and the frequency of the local oscillation signal outputted from the local oscillator 3 is f2, a signal having the frequency of f1–f2 is outputted from a mixer 2.

BPFs 4 and 6 are provided in foregoing and subsequent stages of an intermediate frequency amplifier circuit 5, and extract only a frequency component in proximity to 10.7 MHz from an inputted intermediate frequency signal in the case of the FM receiver, for instance The intermediate frequency amplifier circuit 5 amplifies the intermediate frequency signal.

A limit circuit 7 amplifies the inputted intermediate frequency signal with a high gain. The limit circuit 7 is constituted by cascading amplifiers in a plurality of stages, and amplifies an input signal with a gain of 90 dB or so in its entirety for instance. An FM detection circuit 8 performs an FM detection process to an FM signal of a constant amplitude outputted from the limit circuit 7.

Figure 2:
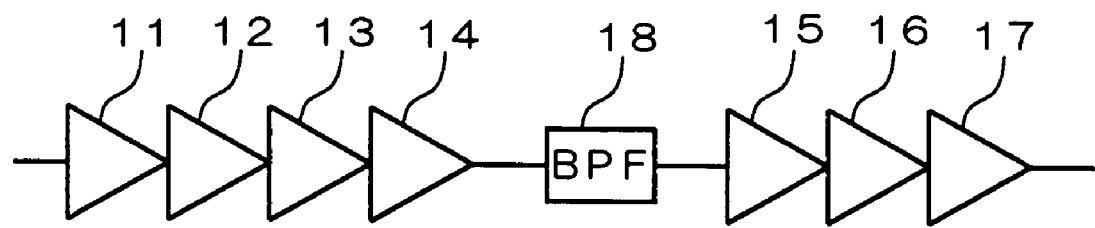
FIG. 2 is a diagram showing a configuration of the limit circuit according to the first embodiment.

FIG. 2 is a diagram showing a configuration of the limit circuit 7 according to this embodiment. As shown in FIG. 2, the limit circuit 7 according to this embodiment is comprised of the amplifiers in seven stages 11 to 17 and a BPF 18 inserted between a fourth-stage amplifier 14 and a fifth-stage amplifier 15. Each of the amplifiers 11 to 17 has a predetermined gain, and the limit circuit 7 in its entirety has the gain wherein the gains of the amplifiers 11 to 17 are multiplied. The limit circuit 7 is integrally formed on a semiconductor substrate together with other circuits by using a CMOS process or a MOS process. It is thereby possible to simplify a manufacturing process so as to reduce the component costs or the product costs of the entire FM receiver.

Figure 3:
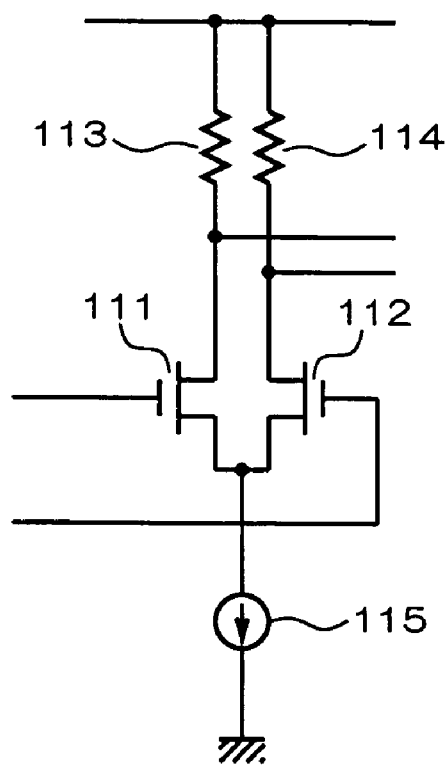
FIG. 3 is a circuit diagram showing a configuration of an amplifier included in the limit circuit shown in FIG. 2.

FIG. 3 is a circuit diagram showing the configuration of the amplifier 11. Moreover, the other amplifiers 12 to 17 also have the same configuration as the amplifier 11. As shown in FIG. 3, the amplifier 11 is comprised of a pair of n-channel MOS type transistors (FET) 111, 112, resistances 113, 114 which are drain resistances and a constant current circuit 115. The constant current circuit 115 is connected in common to the respective sources of the two transistors 111, 112. For this reason, the total of currents running between the source and drains of the transistors 111, 112 is equal to the current generated by the constant current circuit 115. In addition, the signal outputted from a circuit in the foregoing stage is inputted between the gates of the two transistors 111, 112.

Thus, the amplifier 11 has the two transistors 111, 112 for performing differential operation, and has the gain of approximately 13 dB for instance. Therefore, the limit circuit 7 in its entirety can realize the gain of approximately 90 dB in theory by cascading the amplifiers in seven stages 11 to 17 of the same configuration.

However, even if an attempt is made to obtain such a high gain, the amplifiers become saturated with the 1/f noise and heat noise normally so that the gain which is sufficiently high cannot be obtained. In particular, in the case of the MOS type transistors 111, 112, influence of the 1/f noise conspicuously appears.

In general, the 1/f noise is the noise appearing in a low-frequency area of the signal, and the lower the frequency becomes, the higher a noise level becomes. Inversely, the heat noise is the noise appearing in a high-frequency area of the signal, and the higher the frequency becomes, the higher the noise level becomes. A noise voltage vn generated by the MOS type transistors can be represented as follows.

$$v_n = \sqrt{((8kT(1+\eta)/(3g_m) + KF/(2f\, C_{ox}WLK'))\Delta f)} \quad (1)$$

Here, k is a Boltzmann's constant, T is an absolute temperature, $g_m$ is a mutual conductance, Cox is a capacity between the gate and channel sandwiching a gate oxide film, W is a gate width, L is a gate length, f is a frequency and $\Delta f$ is a bandwidth of the frequency f. KF is a noise parameter which is a value between $10^{-20}$ and $10^{-25}$ or so. $\eta$ and K' are predetermined parameters.

In this formula, the first term on the right side indicates the heat noise, and it apparently becomes larger in proportion as a temperature (T) rises. The second term on the right side indicates the 1/f noise, and it is apparently in proportion to the reciprocal of f.

Thus, as for the signals inputted and outputted among the amplifiers 11 to 17, a lot of the 1/f noise is included in the low-frequency area thereof and a lot of the heat noise is included in the high-frequency area thereof. And if the signals are amplified with the high gain by a differential amplifier of a wide band as shown in FIG. 3, the amplitude of these noise components is amplified more than a power supply voltage and is clipped. Therefore, as for mainly the amplifiers 15 to 17 mainly connected to the subsequent stages, the gain set in the case of using them separately cannot be obtained.

To avoid such an inconvenience, the limit circuit 7 according to this embodiment has the BPF 18 inserted as a bandpass filter between a fourth-stage amplifier 14 and a fifth-stage amplifier 15. The BPF 18 is intended to pass the components to be amplified included in the signal and eliminate the above-mentioned 1/f noise and heat noise. In the case of the FM receiver according to this embodiment shown in FIG. 1, it is sufficient if the limit circuit 7 can amplify only the band of the intermediate frequency signal in proximity to 10.7 MHz outputted from a BPF 6 connected to the subsequent stage to the intermediate frequency amplifier circuit 5. Therefore, as for a characteristic of the BPF 18, it is necessary to set the lower cutoff frequency (MHz) at a value equal to or lower than 10.7–α (2α is the band of the intermediate frequency signal) and capable of sufficiently eliminating the 1/f noise and also set the upper cutoff frequency at a value equal to or higher than 10.7+α and capable of sufficiently eliminating the heat noise.

In addition, as for an inserting position of the BPF 18, it is desirable to set it in the subsequent stage to the fourth-stage amplifier 14 as shown in FIG. 2 or in the subsequent stage to the third-stage amplifier 13. It is thus possible to set the number of the stages of the amplifiers connected to the foregoing stage side of the BPF 18 and that of the amplifiers connected to the subsequent stage side thereof almost equal so as to prevent the noise components from extremely increasing on the amplifiers in the respective final stages on the foregoing stage side and subsequent stage side (the fourth and seventh stages in FIG. 2).

Thus, the limit circuit 7 according to this embodiment has the BPF 18 inserted almost in the middle of the amplifiers cascaded in seven stages 11 to 17, and has the 1/f noise and heat noise amplified so far eliminated. Therefore, the amplifier 17 in the final stage will not be saturated with these noise components and have the gain limited, and so the limit circuit 7 in its entirety can secure the high gain.

Second Embodiment

The above-mentioned first embodiment eliminates the noise components simply by inserting one BPF almost in the middle of the amplifiers in a plurality of stages. It is possible, however, to eliminate the noise components on the amplifier in each stage.

Figure 4:
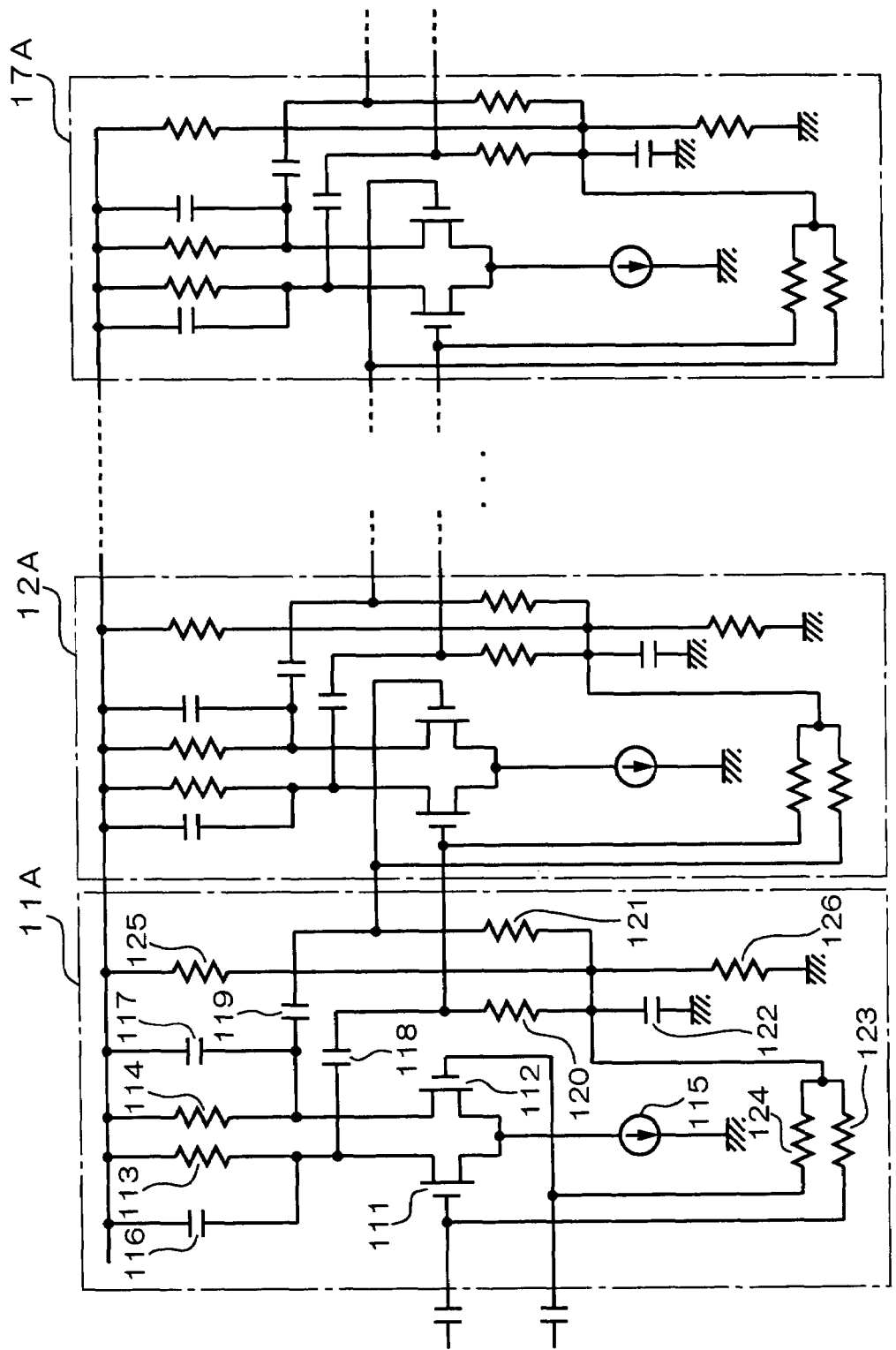
FIG. 4 is a circuit diagram showing a configuration of the limit circuit according to a second embodiment.

FIG. 4 is a circuit diagram showing the configuration of the limit circuit according to a second embodiment. The limit circuit according to this embodiment shown in FIG. 4 is constituted by cascading the amplifiers in seven stages 11A, 12A, . . . 17A. As the configurations of these amplifiers are basically the same, the detailed configuration and operation will be described hereafter by paying attention to the first-stage amplifier 11A.

The amplifier 11A is comprised of two transistors 111, 112, eight resistances 113, 114, 120, 121, 123, 124, 125 and 126, a constant current circuit 115 and five capacitors 116 to 119 and 122. Of these, the transistors 111, 112, resistances 113, 114 and constant current circuit 115 are in common with the configuration of the amplifier 11 shown in FIG. 3, and so they are given the same reference numerals.

The capacitor 116 is connected in parallel to the resistance 113 which is the drain resistance of the one transistor 111, and eliminates a high-frequency component included in one output signal outputted from the drain of the transistor 111. Likewise, the capacitor 117 is connected in parallel to the resistance 114 which is the drain resistance of the other transistor 112, and eliminates the high-frequency component included in the other output signal outputted from the drain of the transistor 112. These resistances 113, 114 and capacitors 116, 117 correspond the high-frequency component elimination unit.

The capacitor 118 eliminates a DC component from the one output signal outputted from the drain of the transistor 111 and inputted to the amplifier 12A in the subsequent stage. In addition, the capacitor 118 constitutes an HPF (high-pass filter) together with the resistance 120, and the low-frequency component included in the signal outputted from the transistor 111 is eliminated by the HPF.

Likewise, the capacitor 119 eliminates the DC component from the other output signal outputted from the drain of the transistor 112 and inputted to the amplifier 12A in the subsequent stage. In addition, the capacitor 119 constitutes the HPF together with the resistance 121, and the low-frequency component included in the signal outputted from the transistor 111 is eliminated by the HPF.

The resistances 125, 126 are intended to set a bias voltage of the transistors 111, 112.

In addition, the respective one ends of the above-mentioned resistances 120, 121 are connected in common, and the capacitor 122 is inserted between this connection point and a ground. An LPF (low-pass filter) is constituted by the resistances 120, 121 and capacitor 122. To be more specific, the signals separately outputted from the transistors 111, 112 have only the low-frequency components extracted by this LPF, and are fed back as the signals in phase to the gates of the transistors 111, 112 via the resistances 123, 124 respectively. Consequently, the low-frequency components in the signals inputted to the first-stage amplifier 11A are inputted to the next-stage amplifier 12A at the as-is signal level without the transistors 111, 112 operating as the differential amplifiers. A feedback circuit comprised of the resistances 120, 121, 123, 124 and capacitor 122 corresponds the low-frequency component elimination unit.

Thus, the first-stage amplifier 11A has the high-frequency component eliminated from the signals outputted from the drain of the one transistor 111 via the capacitor 116 so as to effectively eliminate the heat noise generated by the transistor 111. In addition, the low-frequency components are eliminated from the signals by the HPF comprised of the capacitor 118 and resistance 120 so as to effectively eliminate the 1/f noise generated by the transistor 111.

Likewise, the high-frequency components are eliminated from the signals outputted from the drain of the other transistor 112 via the capacitor 117 so as to effectively eliminate the heat noise generated by the transistor 112. In addition, the low-frequency components are eliminated from the signals by the HPF comprised of the capacitor 119 and resistance 121 so as to effectively eliminate the 1/f noise generated by the transistor 112.

Furthermore, the low-frequency components included in the signals outputted from the respective drains of the transistors 111, 112 are fed back in phase to an input side by the LPF comprised of the resistance 120, 121 and the capacitor 122. As no amplifying operation in the amplifier 11A is performed as to these low-frequency components, the 1/f noise can be further reduced.

Incidentally, the above-mentioned amplifier 11A has the capacitors 116, 117 connected in parallel to the resistances 113, 114 respectively. However, it is also possible to insert the capacitors 116, 117 between the drain and ground (or a fixed potential other than that) of each of the transistors 111, 112.

As for the capacitors 116, 117, it is also possible to utilize a parasitic capacitance of the transistors included in the next-stage amplifier 12A.

Figure 5:
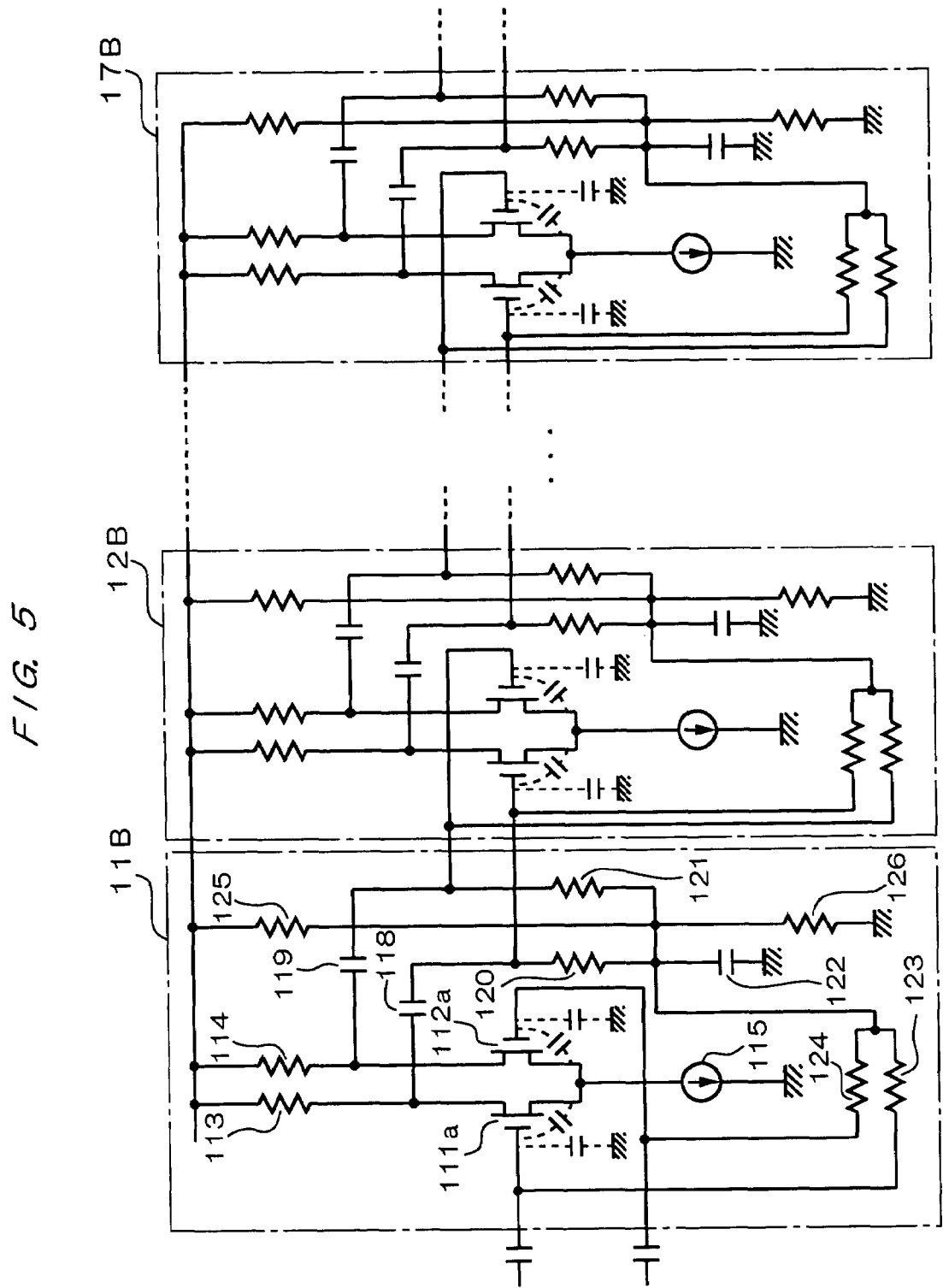
FIG. 5 is a circuit diagram showing a configuration of the limit circuit having the number of capacitors reduced by utilizing parasitic capacitance of transistors.

FIG. 5 is a circuit diagram showing the configuration of the limit circuit having the number of the capacitors reduced by utilizing the parasitic capacitance of the transistors. The limit circuit shown in FIG. 5 is constituted by cascading amplifiers in seven stages 11B, 12B, . . . , 17B. Compared to the configuration shown in FIG. 4, it is different in that the capacitors 116, 117 connected in parallel to the drain resistances are omitted and that the transistors 111, 112 are replaced by transistors 111a, 112a of which gate length L and gate width W are set larger.

It is generally known that a noise current generated by the transistor is in proportion to the reciprocal of the gate length L. Therefore, it is possible to reduce the noise current by setting the gate length L longer. However, a channel resistance increases if the gate length L becomes longer, and so it is desirable to set the gate width W wider correspondingly to reduce the channel resistance. Thus, if the gate length L and gate width W are set larger in order to reduce the noise current, the area of a gate electrode becomes larger and the parasitic capacitance also becomes larger. Therefore, it becomes possible to secure a capacity value of a certain level so that the parasitic capacitance can be used instead of the capacitors 116, 117.

Thus, it is possible, by increasing both the gate length L and gate width W and thereby increasing the parasitic capacitance and then omitting the capacitors 116, 117, to eliminate the high-frequency components of the signals, that is, the heat noise further effectively. In addition, it is needless to mention that the costs can be reduced by omitting the capacitors 116, 117.

Third Embodiment

Figure 6:
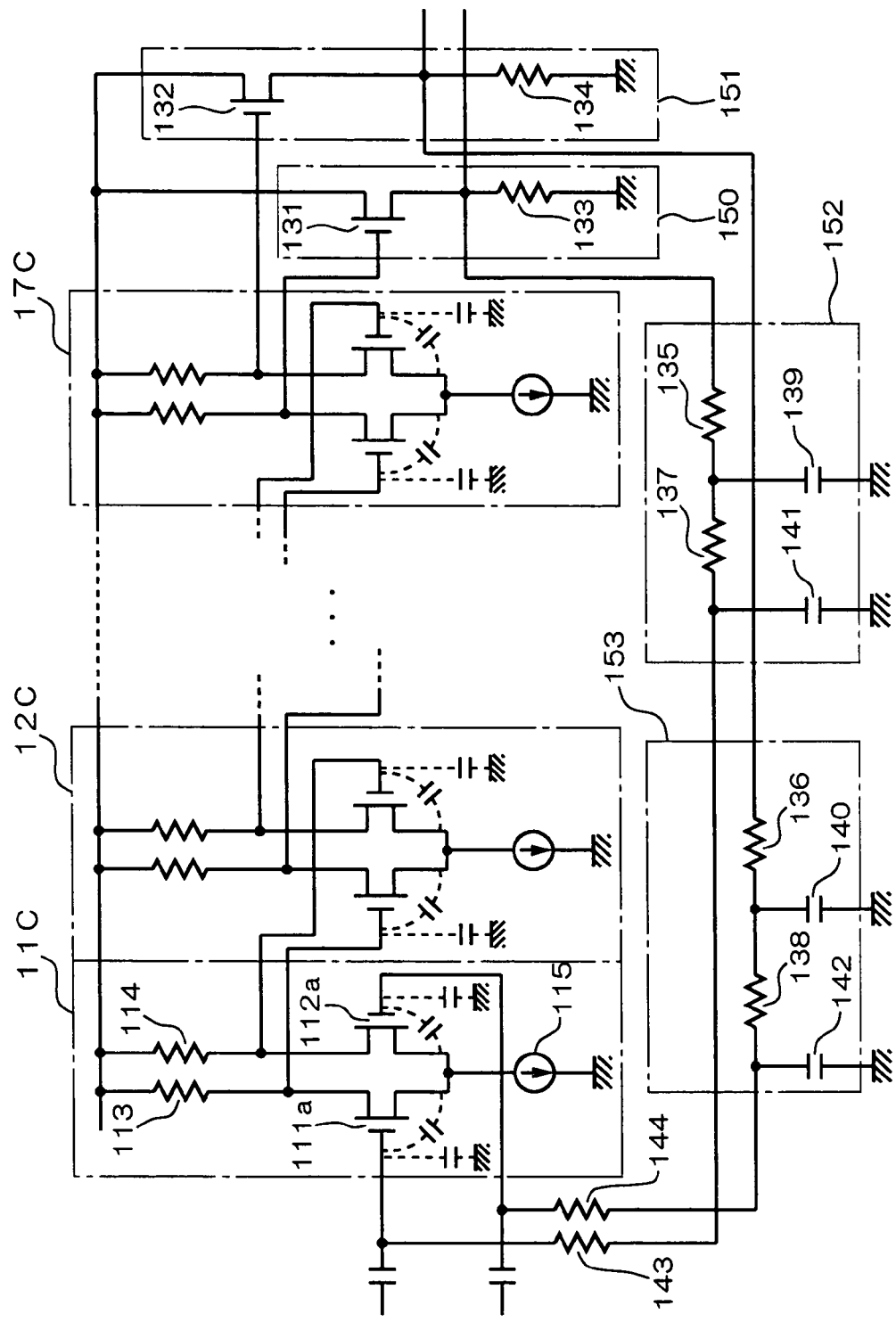
FIG. 6 is a circuit diagram showing a configuration of the limit circuit according to a third embodiment.

FIG. 6 is a circuit diagram showing the configuration of the limit circuit according to a third embodiment. The limit circuit according to this embodiment shown in FIG. 6 includes the amplifiers cascaded in seven stages 11C, 12C, . . . 17C and an additional circuit for taking out the signal outputted from the final-stage amplifier 17C and feeding it back to the first-stage amplifier 11C.

As the configuration of each of the amplifiers 11C to 17C is the same, a description will be given hereafter by paying attention to the first-stage amplifier 11C.

The amplifier 11C is comprised of the transistors 111a, 112a, resistances 113, 114 and constant current circuit 115. The amplifier 11C has the configuration which is basically the same as the amplifier 11A shown in FIG. 3. However, the transistors 111a, 112a shown in FIG. 5 are used instead of the transistors 111, 112. To be more specific, the transistors 111a, 112a have the gate length L and gate width W set large so that the gate area of a size suited to eliminating the heat noise included in the high-frequency components is secured. It is thereby possible to effectively eliminate the heat noise included in the signals inputted to the amplifier in each stage.

In addition, the additional circuit provided to the limit circuit according to this embodiment includes a source follower circuit 150 comprised of a transistor 131 and a resistance 133, a source follower circuit 151 comprised of a transistor 132 and a resistance 134, an LPF 152 comprised of resistances 135, 137 and capacitors 139, 141 and an LPF 153 comprised of resistances 136, 138 and capacitors 140, 142.

One differential output signal outputted from the final-stage amplifier 17C is taken out as one output signal of the limit circuit via the source follower circuit 150, and is fed back to one input terminal of the first-stage amplifier 11C via the LPF 152 and a resistance 143. Likewise, the other differential output signal outputted from the final-stage amplifier 17C is taken out as the other output signal of the limit circuit via the source follower circuit 151, and is fed back to the other input terminal of the first-stage amplifier 11C via the LPF 153 and a resistance 144.

Incidentally, the limit circuit according to this embodiment includes the amplifiers in seven stages (odd number) 11C to 17C, the phase of the signal outputted from the final-stage amplifier 17C is reversed to that of the signal outputted from the first-stage amplifier 11C. Therefore, extracting only the low-frequency component of the signal outputted from the source follower circuits 150, 151 with the LPFs 152, 153 and feeding it back to the first-stage amplifier 11C is nothing but to eliminate only this low-frequency component by reducing the gain corresponding to this component. To be more specific, it is possible, by forming a feedback loop shown in FIG. 6, to effectively eliminate the 1/f noise included in the low-frequency component.

Thus, it is also possible to effectively eliminate the 1/f noise by forming the feedback loop in the entire limit circuit and feeding back only the low-frequency component of the output signal to the input side of the first-stage amplifier 11C. In addition, it is possible, by eliminating the high-frequency components in the amplifiers in the stages 11C to 17C, to effectively eliminate the heat noise included in the high-frequency components.

The limit circuit according to this embodiment shown in FIG. 6 eliminates the high-frequency component of the signal by utilizing the parasitic capacitance of the transistor. However, it is also possible to use the capacitor as in the above-mentioned second embodiment shown in FIG. 4. In this case, the gate length L and gate width W of the transistor 111a and so on shown in FIG. 6 should be rendered smaller, and the capacitor should be connected in parallel to the resistances 113, 114.

Fourth Embodiment

The above-mentioned embodiments use the n-channel MOS type FETs as the transistors included in the amplifier in each stage. However, it is also possible to use the p-channel MOS type FETs.

Figure 7:
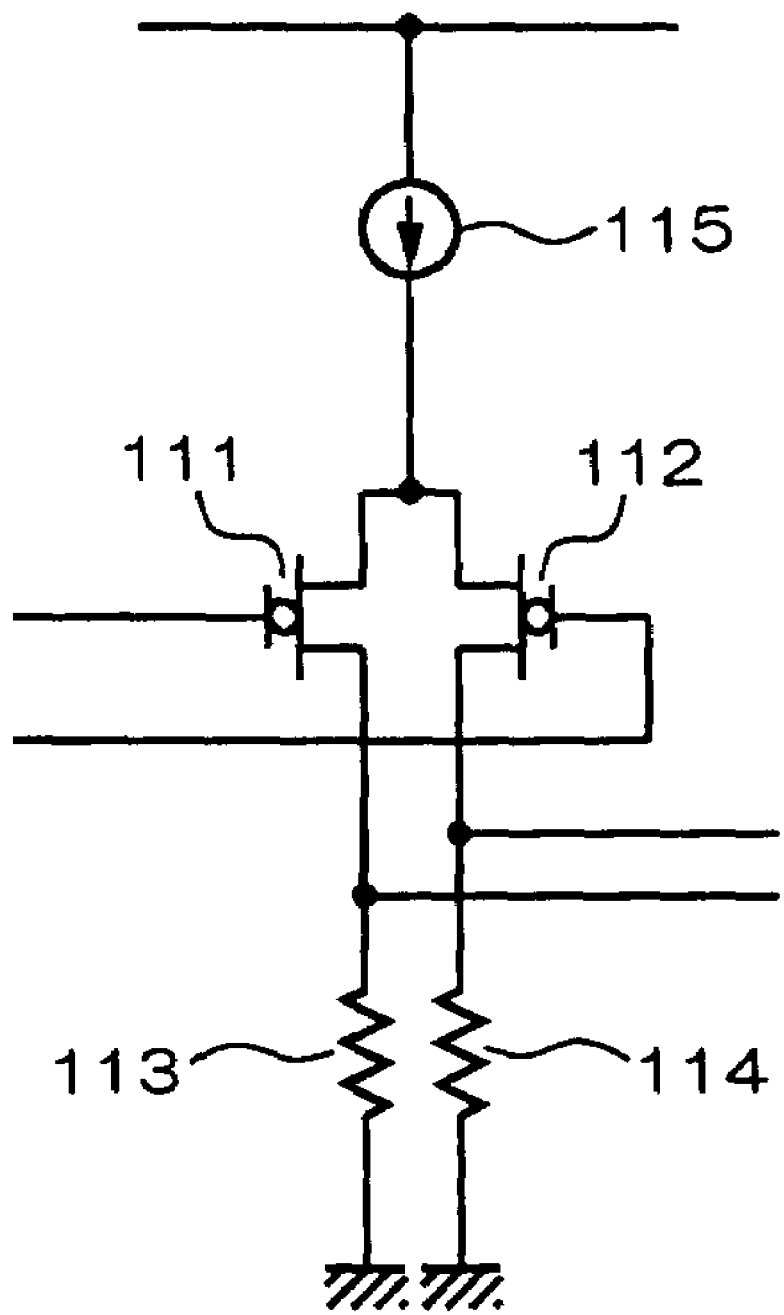
FIG. 7 is a diagram showing a configuration of an amplifier where the configuration equivalent to the amplifier shown in FIG. 3.
Figure 8:
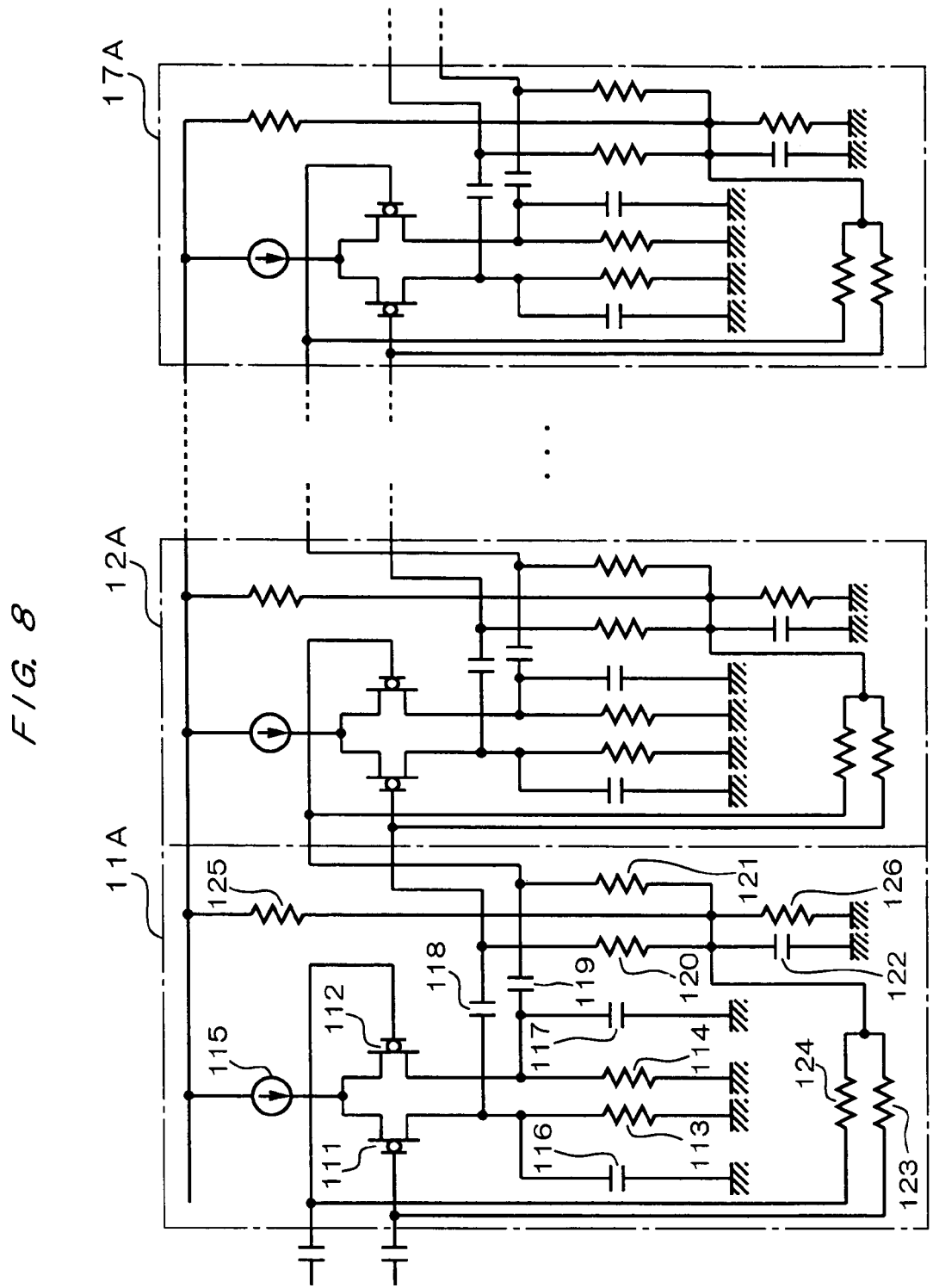
FIG. 8 is a diagram showing a configuration of an amplifier wher the configuration equivalent to the amplifier shown in FIG. 4.
Figure 9:
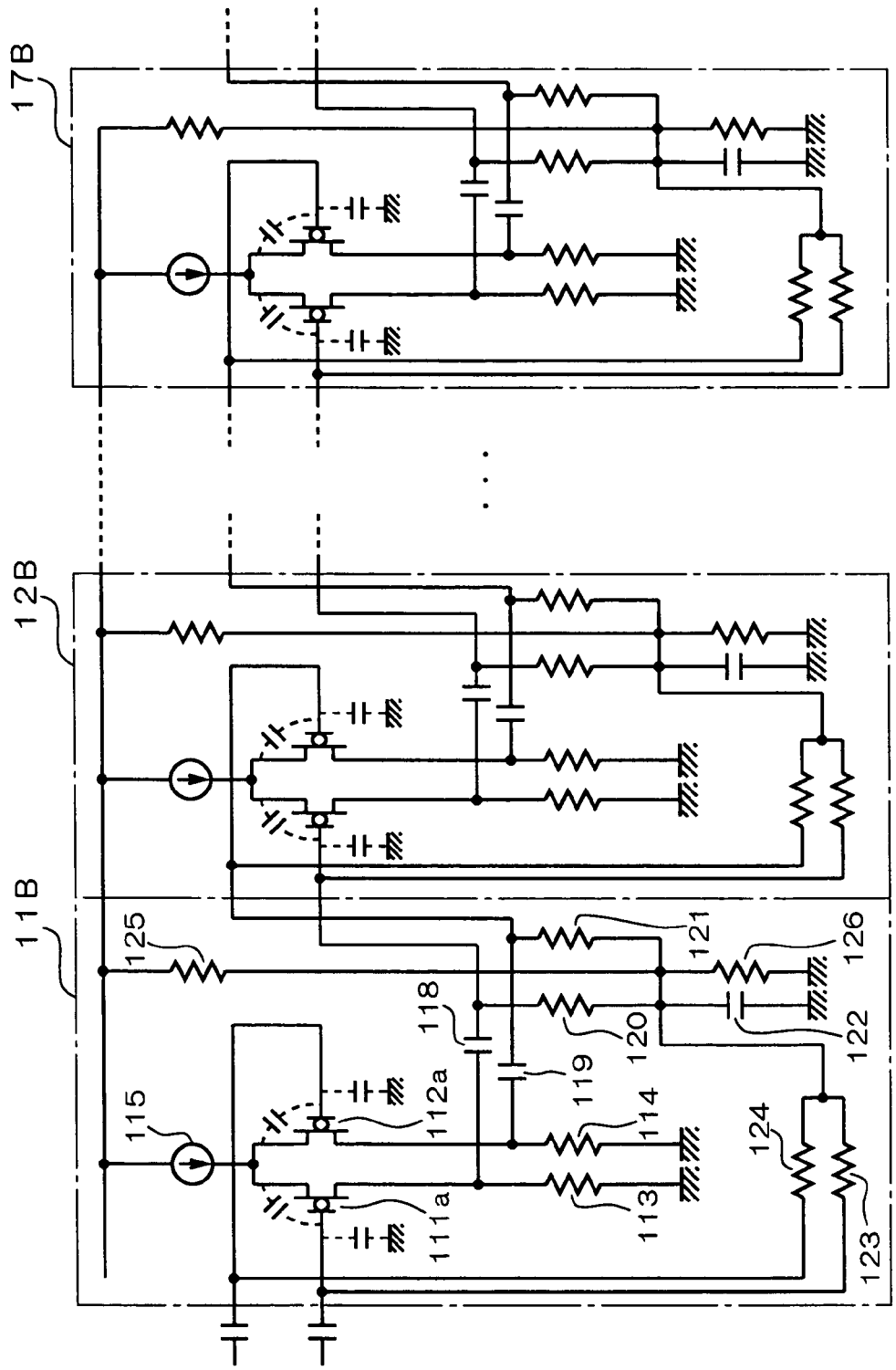
FIG. 9 is a diagram showing a configuration of an amplifier where the configuration equivalent to the amplifier shown in FIG. 5.
Figure 10:
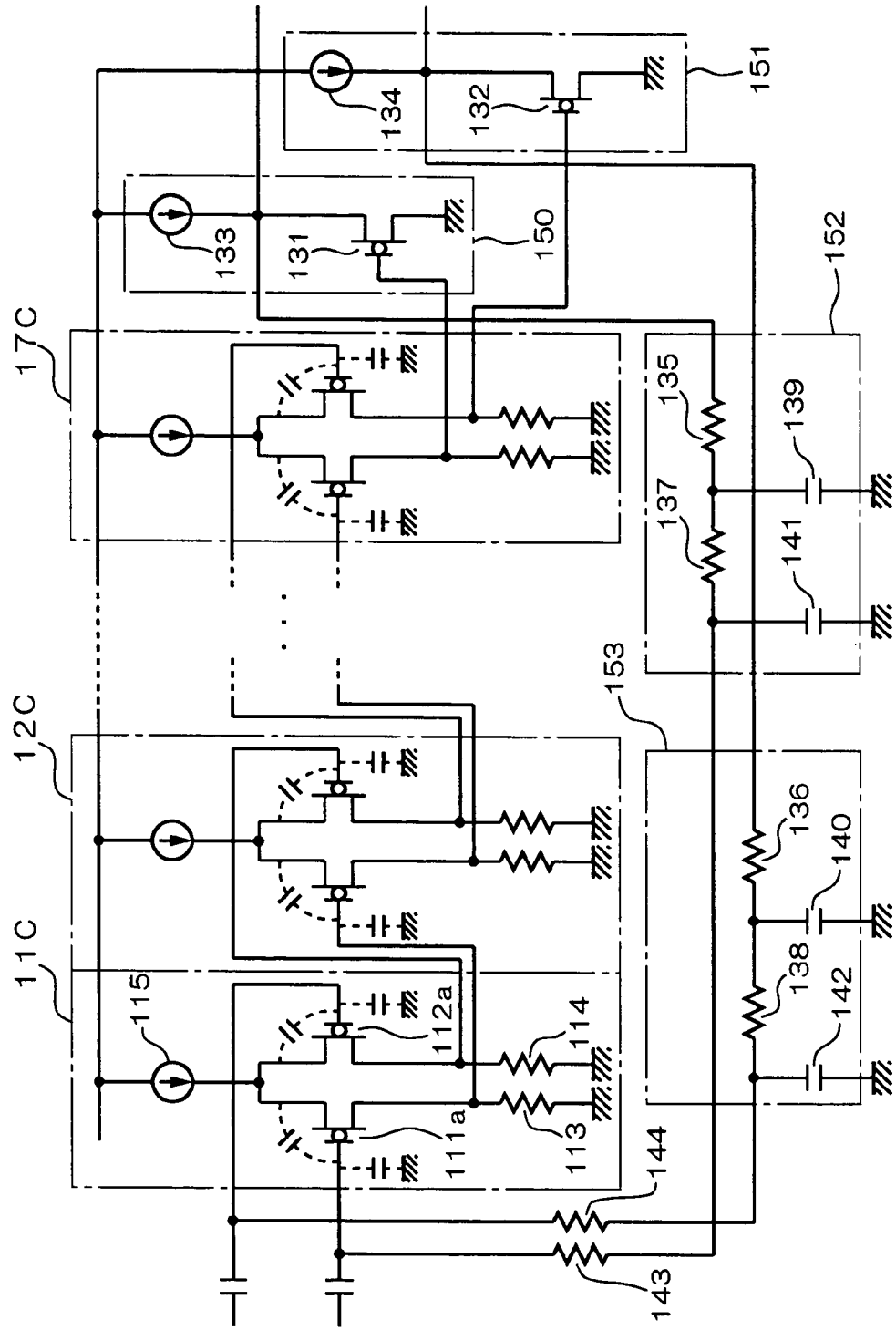
FIG. 10 is a diagram showing a configuration of an amplifier where the configuration equivalent to the amplifier shown in FIG. 6.

FIG. 7 is a diagram showing the configuration of the amplifier using the p-channel MOS type transistors, where the configuration equivalent to the amplifier shown in FIG. 3 is presented. FIG. 8 is a diagram showing the configuration of the amplifier using the p-channel MOS type transistors, where the configuration equivalent to the amplifier shown in FIG. 4 is presented. FIG. 9 is a diagram showing the configuration of the amplifier using the p-channel MOS type transistors, where the configuration equivalent to the amplifier shown in FIG. 5 is presented. FIG. 10 is a diagram showing the configuration of the amplifier using the p-channel MOS type transistors. Each of the configurations shown in FIGS. 7 to 10 has the n-channel MOS type transistors included in the configurations shown in the corresponding FIGS. 3 to 6 replaced by the p-channel MOS type transistors and placement of other elements modified in conjunction with this replacement. As for the reference numerals of the elements included in FIGS. 7 to 10, they are given the same reference numerals as the elements included in the corresponding FIGS. 3 to 6 and having basically the same functions.

Thus, it is possible, by using the p-channel MOS type transistors of which mobility is low as the amplifying elements, to reduce the 1/f noise itself generated in the amplifiers.

In particular, in comparison with bipolar transistors, the MOS type FET has so much 1/f noise that, if the limit circuit 7 is to be constituted just by connecting the amplifiers in multiple stages, the 1/f noise components increase and the necessary gain cannot be obtained. Therefore, in the case where the CMOS process or MOS process is used to integrally form all the components including the limit circuit 7 or other circuits on the semiconductor substrate, it is effective means for reducing the 1/f noise and coming into practical use to use the p-channel type FETs instead of the n-channel type FET.

Fifth Embodiment

The above-mentioned embodiments have the limit circuit constituted by providing the BPF and so on for eliminating the noise components included outside the band in use to the middle or each stage of the plurality of amplifiers connected in multiple stages. However, it is also possible to take counterm asures against the noise in the amplifier in each stage without providing the BPF and so on.

Figure 11:
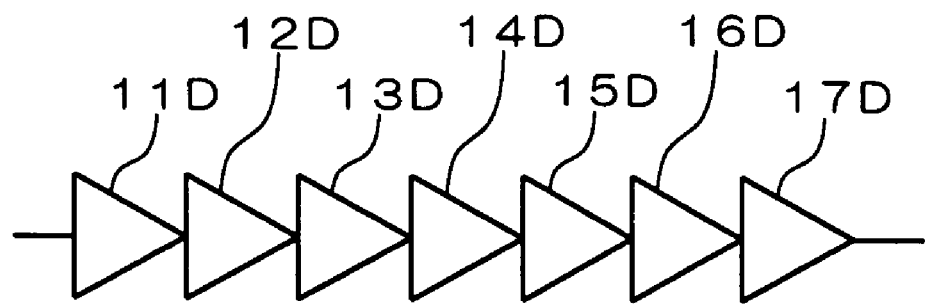
FIG. 11 is a diagram showing a configuration of the limit circuit 7 according to a fifth embodiment.

FIG. 11 is a diagram showing the configuration of the limit circuit 7 according to this embodiment. The limit circuit is integrally formed with the other circuits on the semiconductor substrate by using the CMOS process or MOS process.

The above-mentioned plurality of amplifiers 11D to 17D have the countermeasures against the noise taken for the first to n-th stages. For instance, as for the countermeasures against the noise, a technique of using the p-channel MOS type transistors and a technique of increasing the gate width W and gate length L are used independently or in combination.

As described above, it is possible to reduce the 1/f noise appearing in the low-frequency area by using the p-channel MOS type transistors, which is the technique especially effective when integrally forming the limit circuit on the semiconductor substrate.

Figure 12:
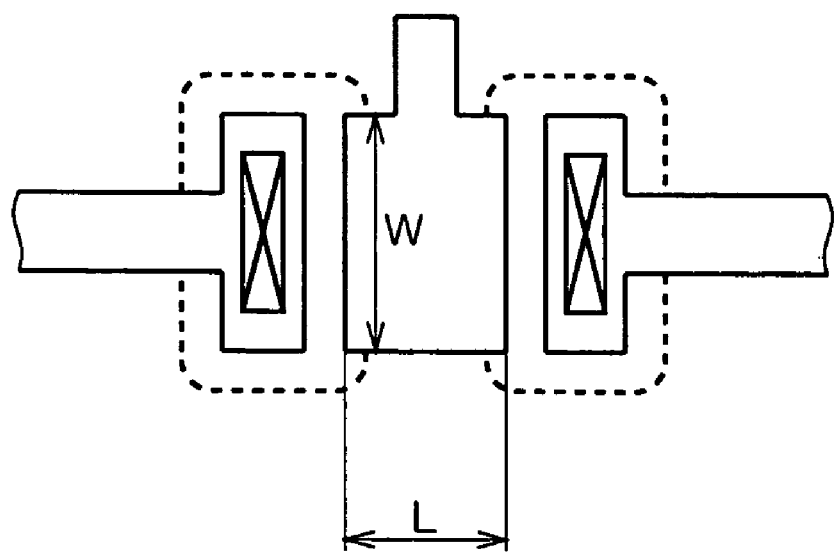
FIG. 12 is a diagram showing gate width W and gate length L of an MOS type transistors.

FIG. 12 is a diagram showing the gate width W and gate length L of the MOS type transistors, where a plane view showing the entirety of the transistors formed close to the surface of the semiconductor substrate is presented.

As described above, the second term on the right side of the formula (1) indicates the 1/f noise and the gate width W and gate length L are in a denominator therein. Therefore, it is shown that the 1/f noise can also be reduced by setting the gate width W and gate length L at large values. In addition, if the gate width W and gate length L are set large, the parasitic capacitance of the transistor shown in FIG. 5 also becomes large so that it also becomes effective for the sake of eliminating the heat noise appearing in a high-frequency area.

Thus, it is possible, by taking the countermeasures against the noise in the first to n-th stages, to prevent the amplifiers from being saturated with the noise components.

Incidentally, if the noise (total of the 1/f noise and heat noise) generated in each of the amplifiers 11D to 17D is $e_{n1}$, $e_{n2}$, $e_{n3}$, $e_{n4}$, $e_{n5}$, $e_{n6}$ and $e_{n7}$, and the gain of each of the amplifiers 12D to 17D is $A_2$, $A_3$, $A_4$, $A_5$, $A_6$ and $A_7$, the noise levels $e_1$, $e_2$, $e_3$, $e_4$, $e_5$, $e_6$ and $e_7$ included in each of the output signals of the amplifiers 11D to 17D are as follows.

$$e_1 = e_{n1}$$

$$e_2 = e_1 A_2 + e_{n2}$$
$$= e_{n1} A_2 + e_{n2}$$

$$e_3 = e_2 A_3 + e_{n3}$$
$$= (e_{n1} A_2 + e_{n2}) A_3 + e_{n3}$$

$$e_4 = e_3 A_4 + e_{n4}$$
$$= ((e_{n1} A_2 + e_{n2}) A_3 + e_{n3}) A_4 + e_{n4}$$

$$e_5 = e_4 A_5 + e_{n5}$$
$$= (((e_{n1} A_2 + e_{n2}) A_3 + e_{n3}) A_4 + e_{n4}) A_5 + e_{n5}$$

$$e_6 = e_5 A_6 + e_{n6}$$
$$= ((((e_{n1} A_2 + e_{n2}) A_3 + e_{n3}) A_4 + e_{n4}) A_5 + e_{n5}) A_6 + e_{n6}$$

$$e_7 = e_6 A_7 + e_{n7}$$
$$= (((((e_{n1} A_2 + e_{n2}) A_3 + e_{n3}) A_4 + e_{n4}) A_5 + e_{n5}) A_6 + e_{n6}) A_7 + e_{n7}$$

While the noise becomes the least by taking the countermeasures against the noise as to all the amplifiers 11D to 17D, the element area becomes larger compared to the case of using the n-channel type FETs if all the transistors are the p-channel type FETs. It is also the same in the case of increasing the gate width W and gate length L, and the element area becomes larger if the countermeasures against the noise are taken. In particular, in the case of integrally forming the limit circuit on the semiconductor substrate, it is desirable to attempt a higher density and reduced costs due to reduction in the occupied space and take the above-mentioned countermeasures against the noise in the first to n-th stages in order to effectively prevent saturation of the amplifiers due to the reduction in the noise.

To be more precise, in the case where a noise level $e_m$ included in the output signal of the m-th stage amplifier is sufficiently larger (a few times larger, for instance) than the noise level occurring when taking no countermeasure against the noise as to the m+1-th stage amplifier, a sufficient effect cannot be expected even if the countermeasures against the noise are taken as to the amplifiers from the m+1-th stage onward, it is sufficient to take the above-mentioned countermeasure against the noise as to the amplifiers up to the m-th stage. It thereby becomes possible to obtain the effects of reducing the chip area and preventing the saturation with the noise in the case of integrally forming the limit circuit on the semiconductor substrate.

Incidentally, it is also possible to perform the following as to up to what stage the gate width W and gate length L of the FETs included in the amplifiers therein should be larger than those of the FETs included in the amplifiers thereafter.

Considering the case of connecting the amplifiers in multiple stages, the 1/f noise generated by the FETs included in the amplifiers in the foregoing stage is amplified by the FETs included in the amplifiers in the subsequent stages thereto. Therefore, it is desirable to reduce the 1/f noise generated by the FETs included in the amplifiers in the foregoing stage for the sake of reducing the overall low-frequency noise. On the other hand, the 1/f noise generated by the FETs included in the amplifier in the subsequent stage is amplified to a lesser extent by the FETs included in the amplifiers in the more subsequent stages thereto, and so it supposedly contributes less to the reduction in the overall low-frequency noise. Therefore, it is possible, by setting the channel length L and channel width W in the FETs included in the amplifier in the subsequent stage at values smaller than those of the FETs in the preceding stages, to reduce the space occupied by the FETs so as to reduce the costs by miniaturizing the chips.

It is also possible, when attention is paid to the FETs included in the amplifiers in an arbitrary position shown in FIG. 11, to set the channel length L and channel width W of the FET included in each amplifier so that the noise component generated by the FET becomes smaller than that included in the input signal of the FET. It is possible, by rendering the noise component generated by any of the FETs included in any of the amplifiers smaller than that included in the input signal of the FET, to reduce the overall low-frequency noise.

It is also possible to apply the technique of using the p-channel MOS type transistors to constitute the amplifiers up to m-th stage and using the n-channel MOS type transistors to constitute the amplifiers from m+1-th stage onward to the limit circuits according to the above-mentioned first to fourth embodiments. It is also possible, in this case, to obtain the effects of reducing the chip area and preventing the saturation due to the reduction in the noise.

Sixth Embodiment

In the case of integrally forming the limit circuit and the other circuits on the semiconductor substrate in the above-mentioned embodiments, the amplifier in each stage using the p-channel type transistors as the amplifying elements is formed on the N-well so as to prevent the noise from running round to another circuit through the semiconductor substrate.

Figure 13:
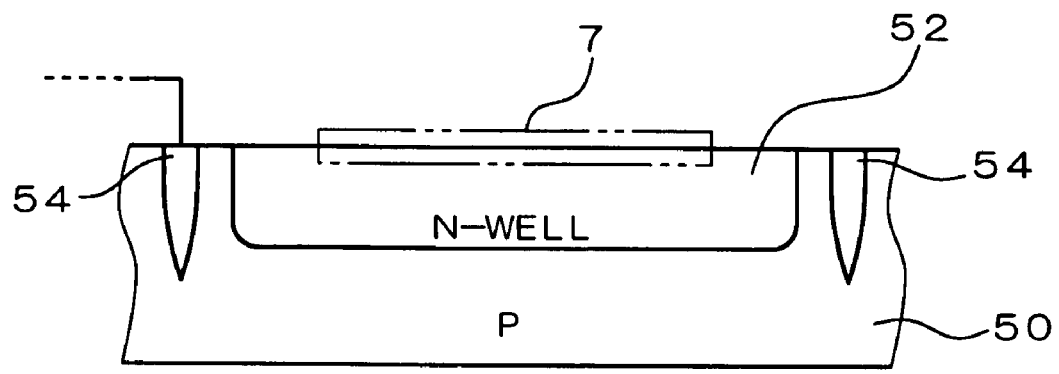
FIG. 13 is a plane view showing an outline configuration of the limit circuit according to a sixth embodiment.
Figure 14:
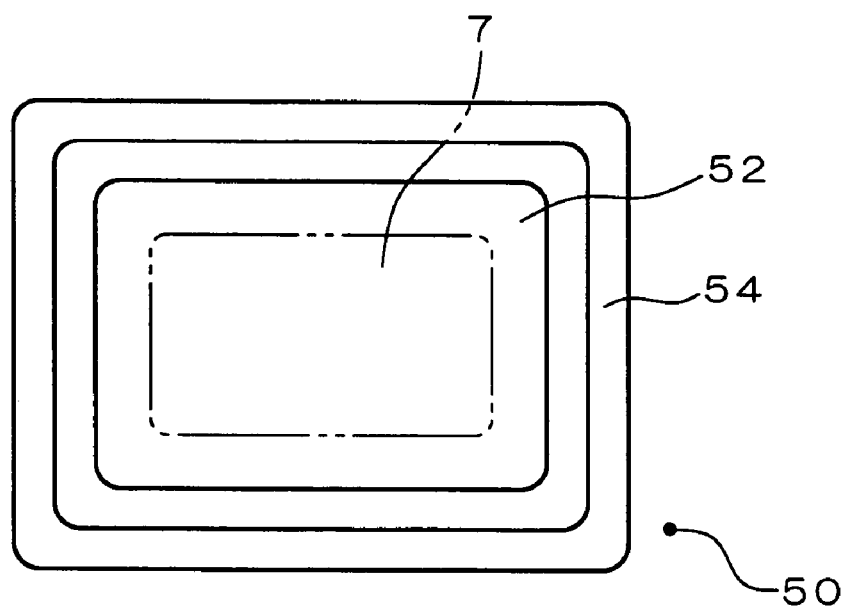
FIG. 14 is a sectional view of the configuration shown in FIG. 13.

FIG. 13 is a plane view showing an outline configuration of the limit circuit according to a sixth embodiment. FIG. 14 is a sectional view of the configuration shown in FIG. 13. As for the configuration in FIG. 13, in the case where the amplifier in each stage is constituted by using the p-channel type transistors, all the components of the limit circuit 7 are formed on an N-well 52. In the case where the amplifier in each stage up to the m-th stage is constituted by using the p-channel type transistors, all the components of each amplifier up to the m-th stage are formed on the N-well 52.

As a PN joint surface is formed between the N-well 52 and a P-type semiconductor substrate 50, the current running from the N-well 52 to the semiconductor substrate 50 is interrupted on the PN joint surface in the case where the potential of the N-well 52 is higher than that of the semiconductor substrate 50. For this reason, it is possible to prevent the noise generated in the circuit formed on the N-well 52 from running round to another circuit through the semiconductor substrate 50.

In particular, it is possible, by forming the amplifiers in the stages up to the m-th stage on the N-well 52, to prevent the noise generated in the amplifiers in the stages up to the m-th stage from running round to the amplifiers in the stages from the m+1-th onward through the semiconductor substrate 50 so as to further prevent the amplifiers in the stages from the m+1-th onward in the limit circuit from being saturated.

As shown in FIG. 14, a guard ring 54 is formed in an area surrounding the N-well 52 and the proximity of the surface of the semiconductor substrate 50. The guard ring 54 is a portion of a P-type semiconductor substrate 50 formed in an N-type area. As a PNP layer is formed by the guard ring 54 and semiconductor substrate 50, it is possible to effectively prevent the noise generated in the circuit formed on the N-well 52 from running round to another circuit through the proximity of the surface of the semiconductor substrate 50.

In particular, it is desirable to form the guard ring 54 so as to reach a deeper layer area of the semiconductor substrate 50, that is, a point deeper than the N-well 52 for instance. Thus, in the case where the noise generated in the circuit formed on the N-well 52 runs round to another circuit through the downside (inside of the semiconductor substrate 50) of the guard ring 54, it becomes possible to prevent a lower-frequency component from running round. Therefore, it is possible, by forming the amplifiers in the stages up to the m-th stage on the N-well 52, to prevent the 1/f noise generated in the amplifiers in the stages up to the m-th stage from running round to the amplifiers in the stages from the m+1-th onward through the downside of the guard ring 54 so as to further prevent the amplifiers in the stages from the m+1-th onward in the limit circuit from being saturated.

The present invention is not limited to the above embodiments, but a variety of modified implementations are possible within the gist of the present invention. For instance, according to the above-mentioned embodiments, the limit circuit is constituted by the amplifiers cascaded in seven stages, where the number of the stages may be changed as appropriate according to the level at which the gain of the entire limit circuit is to be set. In the case where the level of the 1/f noise included in the low-frequency component or the heat noise included in the high-frequency component is high, it is also feasible to render as one set the amplifiers cascaded in the number of stages not to be saturated with the noise components or in a smaller number than that so as to insert the BPF between the sets instead of inserting one BPF 18 between the fourth-stage amplifier 14 and fifth-stage amplifier 15, as shown in FIG. 2. For instance, in the case where the amplifiers in four stages are vertically connected in a row, if the final-stage amplifier becomes saturated with the noise components, a plurality of BPFs should be used so that the number of consecutively cascaded amplifiers becomes three or less.

While the limit circuit provided in the foregoing stage to the FM detection circuit of the FM receiver was described in the above-mentioned embodiments, the present invention may also be applied to the limit circuit for amplifying the signal prior to various demodulation processes other than the FM detection. For instance, the present invention may be applied to the limit circuit provided in the foregoing stage to a PSF demodulation circuit or a FSK demodulation circuit.

INDUSTRIAL APPLICABILITY

As described above, according to the present invention, it is possible, by using the bandpass filter having a passing band wider than the band of the signal amplified in the limit circuit, to eliminate the 1/f noise existing on a lower-frequency side than the passing band and the heat noise existing on a higher-frequency side than that. Therefore, it is possible to prevent the amplifiers from being saturated with these noise components, and so only the signal component to be originally amplified can be amplified so that the high gain can be obtained as the entire limit circuit.

What is claimed is:

1. A limit circuit provided in a foregoing stage to a detection circuit of a receiver, comprising:
    amplifiers cascaded in a plurality of stages,
    wherein said amplifier in each stage has high-frequency component elimination unit for eliminating components higher-frequency than an upper limit of a band of a signal inputted to said detection circuit and low-frequency component elimination unit for eliminating the components lower-frequency than a lower limit of the band of the signal; and said low frequency component elimination unit comprising a feedback circuit for feeding back the component lower-frequency than a lower limit of the band of said detected signal included in the output signal of said amplifier in each stage to said amplifier in each stage in a reverse phase.

2. The limit circuit according to claim 1, wherein said low-frequency component elimination unit is a high-pass filter in which a cutoff frequency is set at a value lower than said lower limit.

3. The limit circuit according to claim 1, wherein said amplifiers are differential amplifiers for differentially operating two transistors, and said low-frequency component elimination unit is a feedback circuit for inputting in phase to said two transistors a signal of low-frequency components of differential output signals of said amplifier in each stage.

4. The limit circuit according to claim 1, wherein said high-frequency component elimination unit is a low-pass filter in which a cutoff frequency is set at a value higher than said upper limit.

5. The limit circuit according to claim 4, wherein a parasitic capacitance of a transistor included in said amplifier in the next stage is used as a capacitor included in said low-pass filter.

6. The limit circuit according to claim 1, wherein said limit circuit is integrally formed on a semiconductor substrate by using a CMOS process or a MOS process.

7. The limit circuit according to claim 1, wherein p-channel type FETs are used as amplifying elements included in said amplifiers.

8. The limit circuit according to claim 1, wherein p-channel type FETs are used as amplifying elements included in said amplifiers in first to m-th stages at least, and n-channel type FETs are used as the amplifying elements included in said amplifiers from an m+1-th stage onward.

9. The limit circuit according to claim 6, wherein said semiconductor substrate has an N-well formed thereon and all or a part of said component parts are formed on the N-well.

10. The limit circuit according to claim 9, wherein said semiconductor substrate has a guard ring formed around said component parts.

11. The limit circuit according to claim 10, wherein said guard ring is formed from said semiconductor substrate's surface down to a position deeper than said N-well.

12. A limit circuit provided in a foregoing stage to a detection circuit of a receiver, comprising:
   amplifiers cascaded in a plurality of stages,
   wherein said amplifier in each stage has high-frequency component elimination unit for eliminating components higher-frequency than an upper limit of a band of a detected signal inputted to said detection circuit; and
   a feedback circuit for feeding back the components lower-frequency than a lower limit of the band of said detected signal included in the output signal of said amplifier in the final stage to said amplifier in a first stage in a reversed phase.

13. The limit circuit according to claim 12, wherein said high-frequency component elimination unit is a low-pass filter in which a cutoff frequency is set at a value higher than said upper limit.

14. The limit circuit according to claim 13, wherein a parasitic capacitance of a transistor included in said amplifier in the next stage is used as a capacitor included in said low-pass filter.

15. The limit circuit according to claim 12, wherein said limit circuit is integrally formed on a semiconductor substrate by using a CMOS process or a MOS process.

16. The limit circuit according to claim 12, wherein p-channel type FETs are used as amplifying elements included in said amplifiers.

17. The limit circuit according to claim 12, wherein p-channel type FETs are used as amplifying elements included in said amplifiers in first to m-th stages at least, and n-channel type FETs are used as the amplifying elements included in said amplifiers from an m+1-th stage onward.

18. The limit circuit according to claim 15, wherein said semiconductor substrate has an N-well formed thereon and all or a part of said component parts are formed on the N-well.

19. The limit circuit according to claim 18, wherein said semiconductor substrate has a guard ring formed around said component parts.

20. The limit circuit according to claim 19, wherein said guard ring is formed from said semiconductor substrate's surface down to a position deeper than said N-well.

\* \* \* \* \*